United States Patent
Nariman (10) Patent No.: US 7,583,941 B2
(45) Date of Patent: Sep. 1, 2009

(54) APPARATUS AND METHOD TO ADJUST AND FILTER CURRENT DAC SIGNALS

(75) Inventor: Mohammad Nariman, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 468 days.

(21) Appl. No.: 11/643,504

(22) Filed: Dec. 20, 2006

(65) Prior Publication Data

US 2008/0153439 A1    Jun. 26, 2008

(51) Int. Cl.
*H04B 1/04* (2006.01)
(52) U.S. Cl. .................. 455/127.2; 455/574; 330/285
(58) Field of Classification Search .............. 455/550.1, 455/574, 91, 126, 127.1, 127.3, 127.4; 330/133, 330/278, 279, 285
See application file for complete search history.

(56) References Cited

U.S. PATENT DOCUMENTS

| | | | |
|---|---|---|---|
| 7,395,036 B2* | 7/2008 | Akamine et al. | 455/126 |
| 2006/0189285 A1* | 8/2006 | Takano et al. | 455/127.2 |
| 2007/0066250 A1* | 3/2007 | Takahashi et al. | 455/127.1 |

* cited by examiner

*Primary Examiner*—Thanh C Le
(74) *Attorney, Agent, or Firm*—Garlick Harrison & Markison (57) ABSTRACT

A technique to adjust gain and DC level of current DAC signals with offset to generate a voltage signal that is used to control power level of a power amplifier. One or more current mirrors from a set of current mirrors is programmably selected to set gain of a current-to-voltage conversion stage. A second set of current mirrors used to adjust DC level current is oppositely tracked to the current mirrors used for the gain. The opposite tracking allows for deactivation (or activation) of respective current mirrors in the second set in response to activation (or deactivation) of respective gain setting current mirrors to maintain a substantially constant DC level when gain values are changed. An additional set of current mirrors allows for independent compensation of DC offsets.

20 Claims, 4 Drawing Sheets

APPARATUS AND METHOD TO ADJUST AND FILTER CURRENT DAC SIGNALS

BACKGROUND OF THE INVENTION

1. Technical Field of the Invention

The embodiments of the invention relate to wireless communications and more particularly to gain and DC level adjustments for controlling a power amplifier.

2. Description of Related Art

Communication systems are known to support wireless and wire lined communications between wireless and/or wire lined communication devices. Such communication systems range from national and/or international cellular telephone systems to the Internet to point-to-point in-home wireless networks. Generally, each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). The receiver is coupled to an antenna and includes a low noise amplifier, one or more intermediate frequency stages, a filtering stage, and a data recovery stage. The low noise amplifier receives inbound RF signals via the antenna and amplifies them. The one or more intermediate frequency stages mix the amplified RF signals with one or more local oscillators to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

The transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillators to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As the trend for wireless communication devices to support multiple standards continues, recent trends include the desire to integrate the RF portions (i.e., the one or more IF stages and the power amplifier) of GSM and EDGE on to a single chip. GSM uses a GMSK data modulation scheme and EDGE uses an 8-PSK data modulation scheme, which have different requirements for the RF portion of the transmitter. A digital-to-analog converter (DAC) may be used to convert a digital signal from a baseband processor to an analog signal, which is then coupled to a driver that drives a power amplifier of the RF portion of the transmitter. In many instances an intermediate circuitry is imposed between the DAC and the power amplifier (PA) to buffer and adjust the gain of the driver. Even though a variety of DAC, buffer and gain stages may be implemented, integration of various functions allows for a more compact design.

Accordingly, there is a need to develop integrated DAC and PA driver stages to enhance performance of chips designed for wireless communications.

SUMMARY OF THE INVENTION

The present invention is directed to apparatus and methods of operation that are further described in the following Brief Description of the Drawings, the Detailed Description of the Embodiments of the Invention, and the Claims. Other features and advantages of the present invention will become apparent from the following detailed description of the embodiments of the invention made with reference to the accompanying drawings.

DETAILED DESCRIPTION OF THE EMBODIMENTS OF THE INVENTION

The embodiments of the present invention may be practiced in a variety of settings that implement a power amplifier and, particularly, adjusting the gain and DC level prior to driving the power amplifier.

Figure 1:
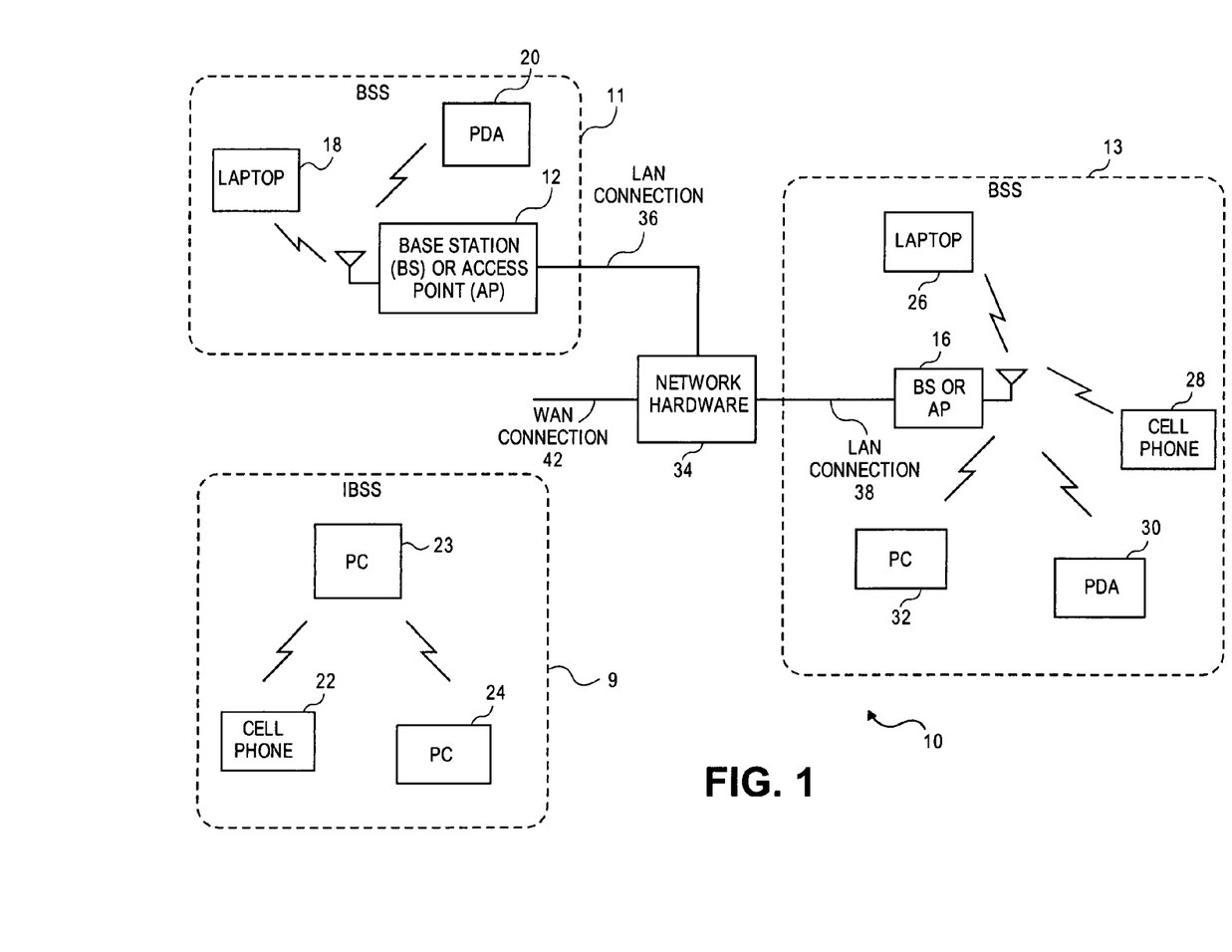
FIG. 1 is a block system diagram illustrating a wireless communication system in accordance with one embodiment of the present invention.

FIG. 1 is a block schematic diagram illustrating a communication system 10 that includes a plurality of base stations and/or access points 12, 16, a plurality of wireless communication devices 18-32 and a network hardware component 34. Network hardware 34, which may be a router, switch, bridge, modem, system controller, et cetera provides a wide area network connection 42 for the communication system 10. Wireless communication devices 18-32 may be laptop host computers 18 and 26, personal digital assistant hosts 20 and 30, personal computer hosts 24 and 32 and/or cellular telephone hosts 22 and 28. One circuitry that may be implemented in one or more of the wireless communication devices of FIG. 1 is described in greater detail with reference to FIG. 2.

Wireless communication devices 22, 23, and 24 are located within an independent basic service set (IBSS) area and communicate directly (i.e., point to point). In this configuration, these devices 22, 23, and 24 typically only communicate with each other. To communicate with other wireless communication devices within system 10 or to communicate outside of system 10, devices 22, 23, and/or 24 affiliate with one of the base stations (BS) or access points (AP).

Base stations or access points 12, 16 are located within basic service set (BSS) areas 11 and 13, respectively, and are coupled to network hardware 34 via one or more of local area network connections 36, 38. Such a connection provides base station or access point 12, 16 with connectivity to other devices within system 10 and may also provide connectivity to other networks via a WAN connection 42. To communicate with the wireless communication devices within its BSS 11 or 13, each of the base stations or access points 12, 16 has an associated antenna or antenna array. For instance, base station or access point 12 wirelessly communicates with wireless communication devices 18 and 20 while base station or access point 16 wirelessly communicates with wireless communication devices 26, 28, 30, 32. Typically, the wireless communication devices register with a particular base station or access point 12, 16 to operate within communication system 10.

Typically, base stations are used for cellular voice and/or data telephone systems and like-type systems, while access points are used for in-home or in-building wireless networks (e.g., IEEE 802.11 and versions thereof, Bluetooth, RFID, and/or any other type of radio frequency based network protocol). Regardless of the particular type of communication system, each wireless communication device includes a built-in radio and/or is coupled to a radio. Note that one or more of the wireless communication devices may include an RFID reader and/or an RFID tag.

Figure 2:
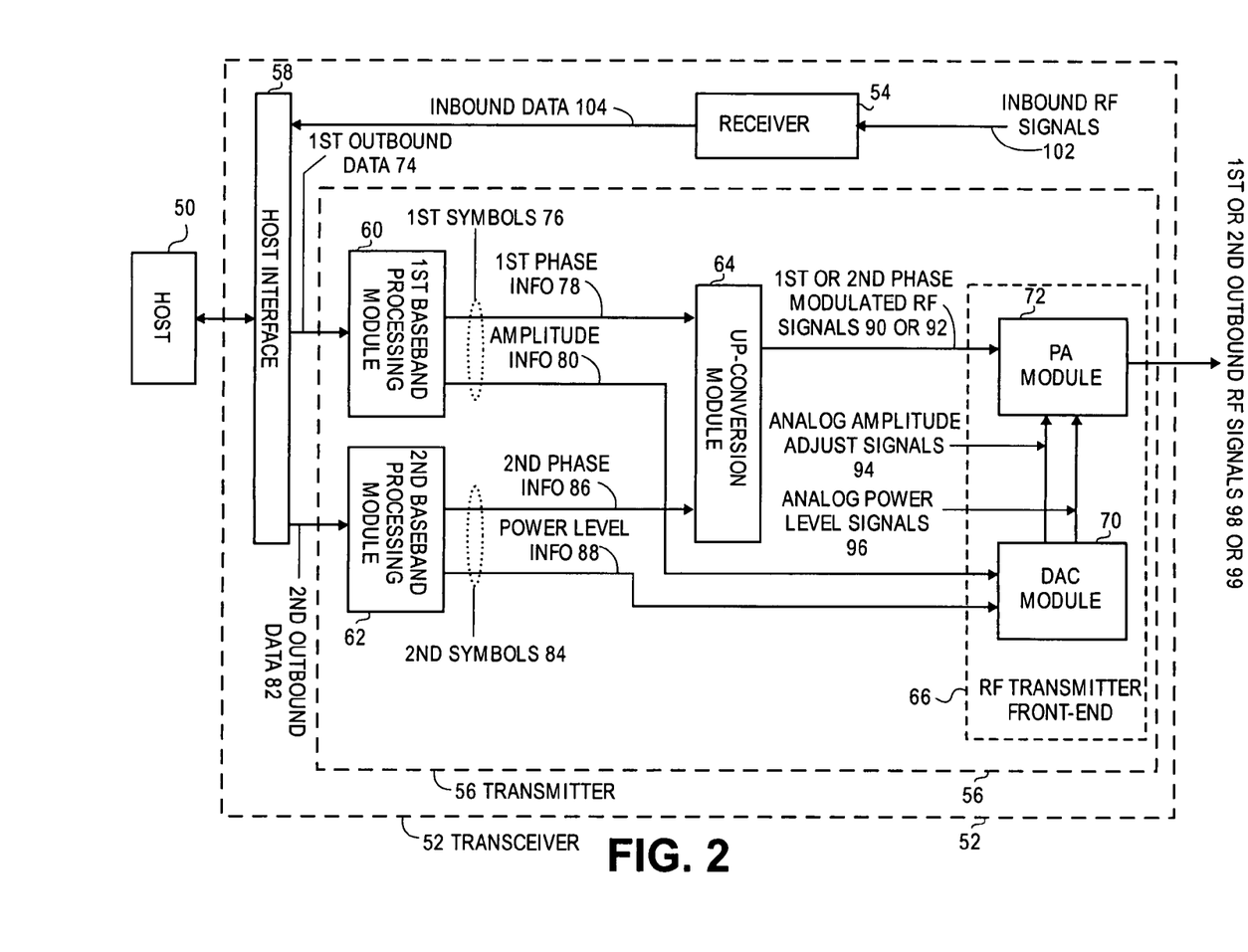
FIG. 2 is a block schematic block diagram illustrating a wireless communication apparatus in accordance with one embodiment of the present invention.

FIG. 2 is a schematic block diagram of an embodiment of a wireless communication device (such as for a device shown in FIG. 1) that includes a host device 50 and a transceiver 52. Host device 50 may include laptop computer circuitry, personal computer circuitry, PDA circuitry, cellular voice and/or data processing circuitry, personal entertainment circuitry, and/or a processing module. The processing module may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may include an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information.

Transceiver 52 includes a receiver 54, a transmitter 56, and a host interface 58. Transmitter 56 includes a $1^{st}$ baseband processing module 60, a $2^{nd}$ baseband processing module 62, an up-conversion module 64, and a radio frequency (RF) front-end 66. RF front-end 66 includes a digital-to-analog conversion (DAC) module 70 and a power amplifier (PA) module 72. The $1^{st}$ and $2^{nd}$ baseband processing modules 60 and 62 may be separate processing modules or a common processing module. Such a processing module may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module may have an associated memory and/or memory element, which may be a single memory device, a plurality of memory devices, and/or embedded circuitry of the processing module. Such a memory device may be a read-only memory, random access memory, volatile memory, non-volatile memory, static memory, dynamic memory, flash memory, cache memory, and/or any device that stores digital information.

When the processing module implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Furthermore, the memory element stores, and the processing module executes, hard coded and/or operational instructions corresponding to at least some of the operations described below.

Receiver 54, which function in accordance with one or more standards (e.g., GSM, EDGE, CDMA, GPRS, etc.), receives inbound RF signals 102 and converts them into inbound data 104. Inbound data 104 is provided to host device

50 via host interface 58. For example, if the inbound RF signals are in accordance with Gaussian Minimum Shift Keying (GMSK) of a version of the GSM standard, they are phase modulated RF signals. In this example, receiver 64 extracts the phase information from the phase modulated RF signals and converts the phase information into inbound data 104. As another example, if the inbound RF signals are in accordance with 8-PSK (phase shift keying) of a version of the EDGE standard, they are phase and amplitude modulated RF signals. In this example, receiver 64 extracts phase information and modulation information from the phase and amplitude modulated RF signals and converts the phase information and amplitude information into inbound data 104.

Transmitter 56 receives $1^{st}$ or $2^{nd}$ outbound data 74 or 82 from host device 50 via host interface 58. The $1^{st}$ outbound data 74 corresponds to data that is to be transmitted in accordance with a wireless communication standard that employs a data modulation scheme having varying amplitudes and varying phases (e.g., 8-PSK of EDGE, quadrature amplitude modulation of IEEE 802.11, etc.) and the $2^{nd}$ outbound data 82 corresponds to data that is be transmitted in accordance with a wireless communication standard that employs a data modulation scheme having varying phases (e.g., GSMK of GSM and GPRS, quadrature-PSK of CDMA, etc.).

When host device 50 desires to transmit the $1^{st}$ outbound data 74 (e.g., an EDGE data transmission), host device 50 places transmitter 56 in a first mode. In the first mode, $1^{st}$ baseband processing module 60 is active to receive $1^{st}$ outbound data 74. The $1^{st}$ baseband processing module 60 converts the $1^{st}$ outbound data 74 into first symbols 76 that include first phase information 76 and amplitude information 80. In one embodiment, $1^{st}$ baseband processing module 60 may encode, puncture, map, interleave, and/or domain convert $1^{st}$ outbound data 74 into polar coordinate symbols of amplitude information 80 (A) and phase information 78 ($\Phi$)). For example, if the baseband processing utilizes an 8-PSK data modulation scheme, a first outbound data value and a second outbound data value may be ½ rate encoded to produce $1^{st}$ and $2^{nd}$ encoded values. After puncturing, the encoded values may be interleaved to produce a first interleaved value and a second interleaved value. The first interleaved value is mapped into an amplitude value of $A_0$ and a phase value of $\Phi_0$ and the second interleaved value is mapped into an amplitude value of $A_1$ and a phase value of $\Phi_1$.

The up-conversion module 64 receives $1^{st}$ phase information 78 and produces therefrom $1^{st}$ phase modulated RF signals 90. DAC module 70 receives amplitude information 80 and converts it into analog amplitude adjust signals 94. PA module 72 amplifies $1^{st}$ phase modulate RF signals 90 in accordance with analog amplitude adjust signals 94 to produce $1^{st}$ outbound RF signals 98. RF front-end 66 and/or the up-conversion module 64 may include synchronization circuitry to ensure that $1^{st}$ phase modulated RF signals 90 and analog amplitude adjust signals 94 correspond, in time, with $1^{st}$ phase information 78 and amplitude information 80.

When host device 50 desires to transmit $2^{nd}$ outbound data 82 (e.g., a GSM voice transmission), host device 50 places transmitter 56 in a second mode. In the second mode, $2^{nd}$ baseband processing module 62 is active to convert $2^{nd}$ outbound data 82 into $2^{nd}$ symbols 84 that include $2^{nd}$ phase information 86 and may also generate power level information 88. In one embodiment, $2^{nd}$ baseband processing module 62 may encode, puncture, map, interleave, and/or domain convert $2^{nd}$ outbound data 82 into polar coordinate symbols of fixed amplitude (A) and $2^{nd}$ phase information 86 ($\Phi$). For example, if the baseband processing utilizes an QPSK data modulation scheme, a first outbound data value and a second outbound data value may be ½ rate encoded to produce $1^{st}$ and $2^{nd}$ encoded values. After puncturing, the encoded values may be interleaved to produce a first interleaved value and a second interleaved value. The first interleaved value is mapped into a fixed amplitude value of A and a phase value of $\Phi_0$ and the second interleaved value is mapped into the amplitude value of A and a phase value of $\Phi_1$. The baseband processing module 62 may then generate a power transmission level 88.

Up-conversion module 64 converts $2^{nd}$ phase information 86 of $2^{nd}$ symbols 84 into $2^{nd}$ phase modulated RF signals 92. The DAC module 70 converts the power level information 88 into analog power level signals 96. PA module 72 amplifies $2^{nd}$ phase modulated RF signals 92 in accordance with analog power level signals 96 to produce $2^{nd}$ outbound RF signals 99.

In one embodiment, $1^{st}$ baseband processing module 60, $2^{nd}$ baseband processing module 62, up-conversion module 64, DAC conversion module 70, and a power amplifier driver of PA module 72 are on the same integrated circuit chip and a power amplifier, coupled to PA module 72 is an external component with respect to the integrated circuit. In another embodiment, the power amplifier is included as part of the integrated circuit.

Various embodiments of the wireless communication device of FIG. 2 may be implemented in a transmitter and/or a receiver utilized for wireless communication. On the transmit side, a number of circuitry may be implemented for DAC module 70. As described above, DAC module 70 may receive power level information 88 in digital form from $2^{nd}$ baseband processing module 62, which information is then converted to generate analog power level signals 96. Power level signals 96 is used to control the power level of the transmitted power in certain modes of operation, such as the above-described GSM mode of voice communication. In one embodiment, DAC module 70 incorporates a current DAC (I-DAC) to generate a current signal that corresponds to the particular input signal. The use of I-DAC allows improved isolation between the digital and analog stages and immunity from voltage (such as supply voltage) variations. Typically, the current signal is then converted to a voltage signal, which is then used as a power control signal for a driver that drives the power amplifier stage.

Figure 3:
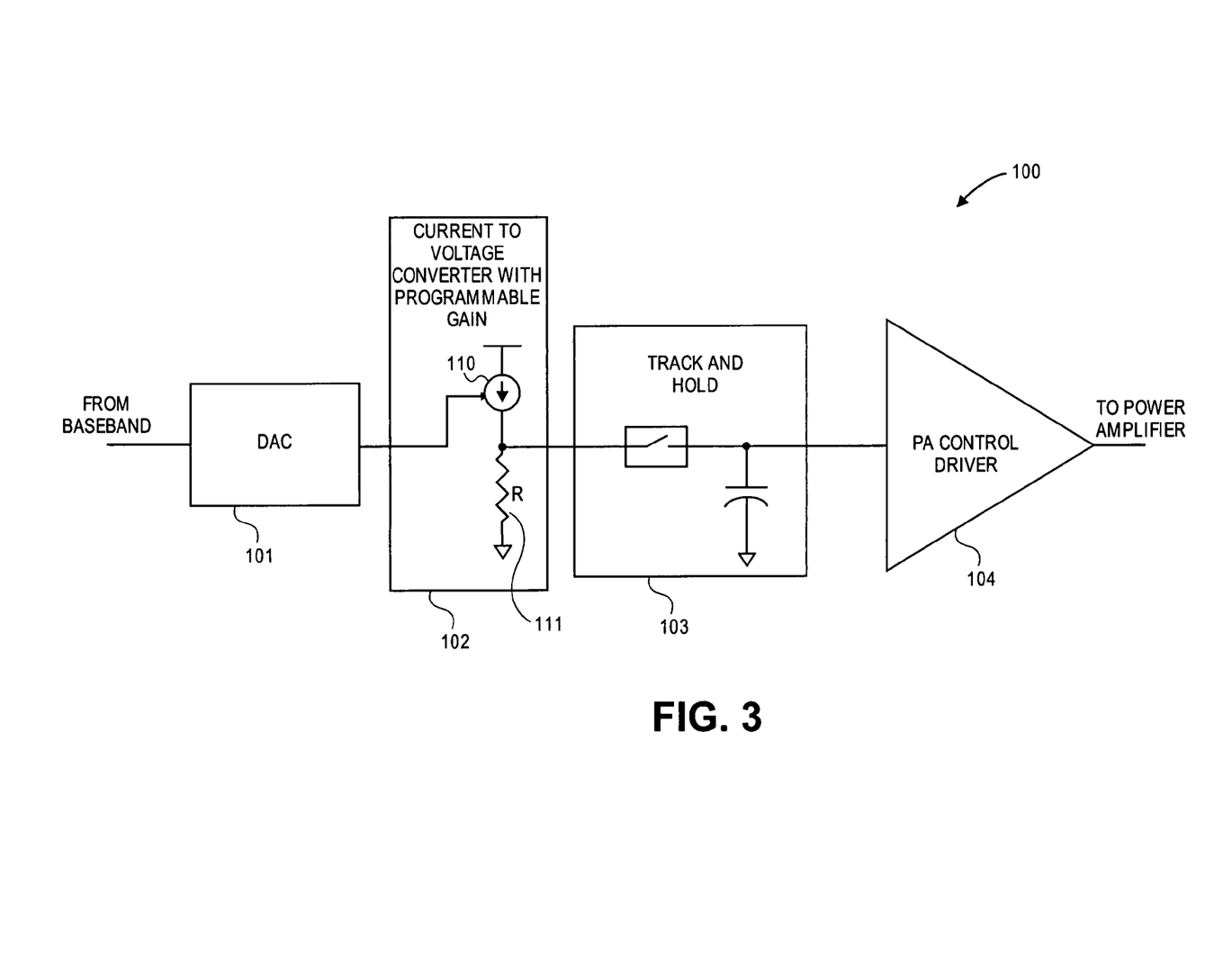
FIG. 3 is a block schematic diagram illustrating one embodiment of a gain and DC level adjust circuitry that is placed between a DAC and a PA driver for a transmitter.

FIG. 3 shows an embodiment of one such circuitry that may be employed to generate a control signal (such as analog power level signals 96 of FIG. 2) that controls the power output from a power amplifier. In FIG. 3, circuit 100 is comprised of DAC 101, current-to-voltage (I-V) module 102, track and hold module 103 and PA control driver 104. In reference to FIG. 2, the various components of circuit 100 are resident within DAC module 70. Furthermore, the baseband input to DAC 101 corresponds to power level info 88 and the output signal from PA control driver 104 to the power amplifier corresponds to analog power level signals 96 in FIG. 2. Although circuit 100 is described in reference with the device of FIG. 2, circuit 100 need not be limited to such use. Various embodiments of circuit 100 may be used in other situations where a control signal is used to control an operational level of an amplifier and/or any application where the output of a current DAC is to be filtered, adjusted and converted to voltage.

Within circuit 100, DAC 101 is used to convert a digital power level signal to an analog signal. In the particular embodiment, an I-DAC is used for DAC 101, in which 1/R current is used by the DAC. Accordingly, DAC 101 receives and converts a digital power level signal to an analog current signal which is then coupled to I-V module 102. In the diagram of FIG. 3, the current value that changes with the power level signal is shown as current source 110 and the current flow through resistor 111 (noted also as R) develops a corresponding voltage to provide the current to voltage conversion.

Furthermore, I-V module 102 is a current to voltage converter that also has a programmable gain capability. That is, I-V module 102 is designed so that the gain factor to multiply the power level signal may be programmably selected in order to allow for different gain multipliers to be used. Additionally, a DC level adjustment is provided within I-V module 102. The DC level adjustment allows for the DC level (hence, DC offset) to be adjusted to select an appropriate DC operational level. As will be described below, in one embodiment, the DC level automatically tracks the gain multiplier, so that as gain values are changed, corresponding DC level value remains substantially constant. Thus, for one embodiment of circuit 100, I-V module 102 provides several functions that include, buffering the output of the I-DAC, converting the current signal to a voltage signal, adjusting the gain multiplier of the signal and adjusting for a DC level of the signal.

Subsequently, the output from I-V module 102 is coupled to track and hold module 103. A variety of track and hold circuitry may be used for track and hold module 103, including a switch and a capacitor. The track and hold circuitry functions to filter DAC noise during the track mode and to reject delta sigma noise in the hold mode (when delta sigma sampling is used). In some embodiments, the track and hold circuitry may not be used at all. The output from track and hold module 103 is coupled to PA control driver 104, which sends the drive signal to control the PA.

Figure 4:
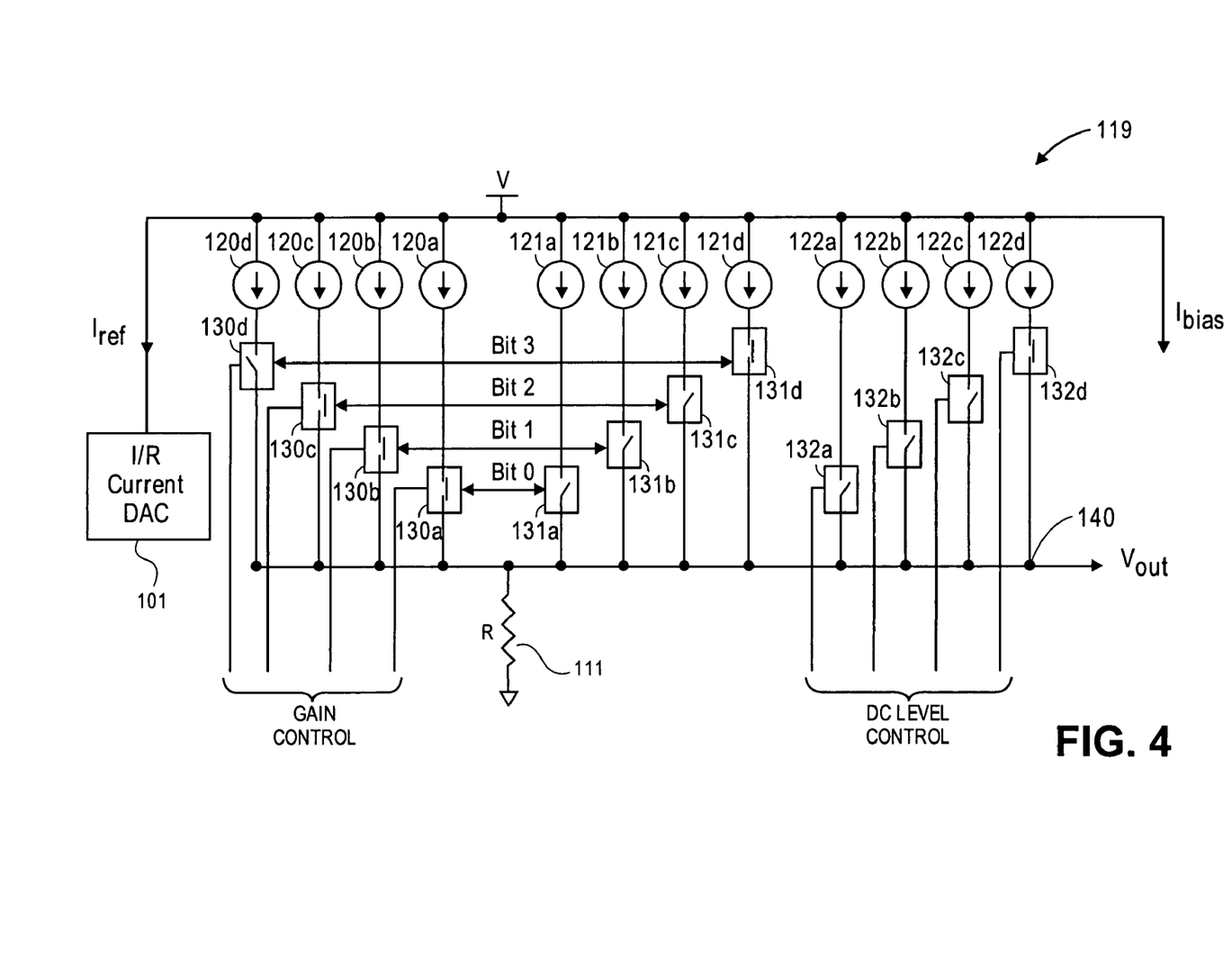
FIG. 4 is a circuit schematic diagram illustrating one embodiment of a current to voltage converter that has programmable gain and a DC level adjust that tracks the gain.

Although a variety of different circuits may be used for V-I module 102, FIG. 4 shows a circuit 119 that may be used as one embodiment of a circuit comprising V-I module 102. In circuit 119, three sets of current multipliers are shown. The three sets of current multipliers are depicted as current sources 120a-d, 121a-d and 122a-d, respectively. The three sets of current sources are current multipliers, in which the multiplying factor depends on the weighting that is given to each of the current multipliers. The multiplying factor may be one, greater than one or less than one.

Similarly, three sets of switches are also shown, each switch corresponding to a particular current source. Thus, switches 130a-d correspond to current sources 120a-d, respectively; switches 131a-d correspond to current sources 121a-d, respectively; and switches 132a-d correspond to current sources 122a-d, respectively. Each current source and its corresponding switch are in separate branches and a particular current source is coupled to node 140 when its switch is closed. Resistor 111 is coupled between node 140 and a supply return (ground in this instance).

Current sources 120 are used to set the gain, while current sources 121 are used to set the DC level that tracks with the gain. Current sources 122 are used to set the DC level independently from the gain. In the particular example embodiment of FIG. 4, there are four current sources 120 for gain adjustment and four current sources 121 for DC level adjustment, which track with the gain adjustment. Since there are four current sources 120a-d and corresponding four switches 130a-d for gain adjustment, four control bits (Bits 3:0) are used to control the switches, one bit per switch. The four-bits allow for sixteen open/close combinations for switches 130a-d. When a particular switch or switches is/are closed, the corresponding current source(s) is coupled to node 140 causing the current to flow through resistor 114. Thus, by selecting appropriate values of current for each current source 120a-d, sixteen different current values (one value being zero when all switches are open) may flow across resistor 111. This allows fifteen different non-zero gain settings to be established to provide fifteen different gain multipliers for the power level signal generated from 1/R I-DAC 101. The current sources 120a-d may be appropriately weighted to provide the different combinations of gain settings.

In one embodiment, current sources 120a-d are obtained by using current mirrors, where the reference side of the current mirror carries the reference current $I_{ref}$ that corresponds to the signal current from I-DAC 101. The mirroring side has four separate branches and mirrors the reference side, except that now the current values of the mirroring side depends on which of the branches are active based on the position of switches 130a-d. The signal current is multiplied by a gain factor based on which of the branches are active. Again, as noted above, one or more of the switches 130a-d is closed based on the gain factor desired for the signal current. The state of switches 130a-d are determined by control bits 3:0, which may be programmable. In one embodiment, bits 3:0 originate from the baseband block and each combination of these bits that is selected by the baseband block corresponds to a power level, which the PA is to generate and/or transmit.

Similarly, current sources 121a-d are obtained by using current mirrors, where the reference side is a DC bias current $I_{bias}$. $I_{bias}$ is a DC level biasing current used to set the DC level. $I_{bias}$ may be a DC offset value coupled from DAC 101. The mirroring side also has four branches and the activation of a particular branch depends on the status of switches 131a-d. The branches of the mirroring side, represented by current sources 121a-d, set the DC level. Although switches 131a-d may be programmed to operate independently, in one embodiment, switches 131a-d track switches 130a-d. However, the on/off state of switches 131a-d is opposite that of corresponding switches 130a-d. Thus, as shown, if switch 130d is open and 130a-c are closed, then switch 131d is closed and switches 131a-c are open. By tracking switches 131 to an opposite state to that of corresponding switches 130, the number of total active branches of the two current mirrors 120 and 130 will remain constant (four in this instance). The DC level branches may have equivalent weighting as the gain branches, but at a DC level, so that when a gain branch is switched in/out, corresponding DC level branch with equivalent DC level weight is switched out/in. In this manner, as gain adjustments are made in one mirroring branch, DC level compensating adjustment is made in the other to maintain a substantially constant DC level across resistor R as gain changes are made. In one embodiment the current branches are binary weighted. However, other weighting may be readily used.

A third set of current mirrors may be used to provide independent DC level adjustment. Current sources 122a-d may be obtained by another set of current mirrors, which reference is also $I_{bias}$, to set the DC level. However, instead of tracking switches 130a-d, switches 132a-d are independently controlled by DC level control bits. In this manner, DC level adjustments may be made independently from the gain setting. It is appreciated that in some embodiments, the independently controlled current sources 122 may not be present. In other embodiments, current sources 122 may be present and used along side current sources 121 to provide additional DC level control. Still in other embodiments, current sources 122 may be used in place of current sources 121 to provide separate programming control of the DC level.

The use of the current mirrors provides buffering between the DAC and the voltage $V_{out}$ at node 140. $V_{out}$, which corresponds to the voltage out of V-I module 102 (FIG. 3), is voltage independent of the DAC supply. If the current mirrors utilize same or similar V/R characteristics with good matching devices, circuit variations between the mirrors may be reduced substantially. Also, the current to voltage conversion is provided by resistor 111 (R) since the signal current and the DC level current flow through this single resistor R, developing both the signal voltage (AC) and the DC level voltage. Although a resistor R is used as a load in the illustrated example, other embodiments may use other types of load. Furthermore, gain and DC level (and DC offset) adjustments may be made at the same node 140 and the gain and DC level adjustments may be made to track each other, or may be controlled independently, or both.

It is to be noted that other embodiments of the invention may be implemented. For example, other embodiments may use more or less branches for gain and/or DC level control. Although four bits are shown to provide 16 combinations for gain and DC level control, that combination may be increased or decreased. Thus gain and DC level resolution may be changed.

In one embodiment, the current multipliers use a cascode current mirrors powered by VDDIO voltage supply (VDDIO is a power supply which is dedicated to input/output signals and, typically, has a higher voltage compared to the regular power supply), which can be high as 3V in 65 nm CMOS technology. The mirroring devices are low voltage devices, which have better matching and avoid headroom problems. However, cascade devices used with the mirrors are high voltage devices to tolerate high voltage supply. Gain and DC programmability may be achieved using various devices, including T-gate devices, which enable the gates of weighted current branches.

Thus, gain adjustments may be provided in a current to voltage converter with compensating changes to the DC level offset, so that the overall DC level remains substantially constant as gain values change. The DC level compensation may track the gain adjustments or the DC level changes may be independently made. The output ($V_{out}$ at node 140) of I-V converter 102 may then be used to deliver a power control (power level) signal to an amplifier, such as a power amplifier in a transmitter, and in which the power control signal has appropriate DC level offset control even when gain adjustments are made to the signal.

Thus, a technique to adjust and filter current DAC signals is described.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more of its corresponding functions and may further include inferred coupling to one or more other items.

Furthermore, the term "module" is used herein to describe a functional block and may represent hardware, software, firmware, etc., without limitation to its structure. A "module" may be a circuit, integrated circuit chip or chips, assembly or other component configurations. Accordingly, a "processing module" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions and such processing device may have accompanying memory. A "module" may also be software or software operating in conjunction with hardware.

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. Similarly, flow diagram blocks and methods of practicing the embodiments of the invention may also have been arbitrarily defined herein to illustrate certain significant functionality. To the extent used, the flow diagram block boundaries and methods could have been defined otherwise and still perform the certain significant functionality. Such alternate definitions of functional building blocks, flow diagram blocks and methods are thus within the scope and spirit of the claimed embodiments of the invention. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

I claim:

1. An apparatus comprising:
   a first plurality of current multipliers to adjust gain of an input signal;
   a first plurality of switches coupled to respective first plurality of current multipliers to switch in and switch out respective first plurality of current multipliers based on a gain control signal;
   a second plurality of current multipliers to adjust a DC level associated with the input signal;
   a second plurality of switches coupled to respective second plurality of current multipliers to switch in and switch out respective second plurality of current multipliers to compensate for DC level changes when first plurality of current multipliers are switched in and out; and
   a load coupled to receive current from switched in first plurality of current multipliers and switched in second plurality of current multipliers, in which the switched in current to the load provides a gain adjusted and DC level, DC offset compensated current signal that is to be converted to a voltage signal.

2. The apparatus of claim 1, wherein the second plurality of switches are oppositely tracked to switching operations of respective first plurality of switches to maintain a substantially constant DC level current to the load when the first plurality of current multipliers are switched in and out.

3. The apparatus of claim 2, wherein the second plurality of switches operate in response to operation of the first plurality of switches to provide the DC level compensated current.

4. The apparatus of claim 3, wherein the second plurality of switches operate independently from operation of the first plurality of switches to provide the DC level compensated current.

5. The apparatus of claim 2, wherein the first and second current multipliers are comprised of current mirrors.

6. The apparatus of claim 2, wherein the first plurality of switches are programmable to select a gain for the input signal.

7. The apparatus of claim 6, wherein the voltage signal is output to control a power level of a power amplifier.

8. An apparatus comprising:
a digital-to-analog converter to receive a digital power level signal and to generate a reference current signal and a bias signal in response to the power level signal;
a first plurality of current multipliers arranged in parallel branches and coupled to the reference current signal to adjust gain of the reference current signal by activating one or more branches of the first plurality of current multipliers;
a first plurality of switches coupled to respective first plurality of current multipliers to switch in and switch out respective branches of the first plurality of current multipliers based on a gain control signal;
a second plurality of current multipliers arranged in parallel branches and coupled to the bias signal to adjust a DC level associated with a gain multiplied reference current signal;
a second plurality of switches coupled to respective second plurality of current multipliers to switch in and switch out respective branches of the second plurality of current multipliers to compensate for DC level changes when first plurality of current multipliers are switched in and out; and
a load coupled to receive current from switched in branches of the first plurality of current multipliers and DC level compensated current from switched in branches of the second plurality of current multipliers, in which total switched in current to the load from active branches provides a gain adjusted and DC level, DC offset compensated current signal that is to be converted to a voltage signal to generate an analog power level signal.

9. The apparatus of claim 8, wherein the second plurality of switches are oppositely tracked to switching operations of respective first plurality of switches, so that when a particular branch of the first plurality of current multipliers is activated, a corresponding branch of the second plurality of current multipliers is deactivated to maintain a substantially constant DC level current to the load when adjusting the gain.

10. The apparatus of claim 9, wherein the first plurality of switches are programmable to select a gain for the reference current signal and the second plurality of switches respond correspondingly.

11. The apparatus of claim 10, wherein the first and second current multipliers are comprised of current mirrors.

12. The apparatus of claim 11, further including:
a third plurality of current multipliers arranged in parallel branches and coupled to the bias signal to independently adjust the DC level associated with a gain multiplied reference current signal; and
a third plurality of switches coupled to respective third plurality of current multipliers to switch in one or more branches of the second plurality of current multipliers in response to a DC level control signal to compensate for DC level changes independently from the second plurality of current multipliers.

13. The apparatus of claim 11, wherein the first and second current multipliers have similar weighting of current multiplication in their respective branches.

14. The apparatus of claim 11, wherein the analog power level signal is output to control a power level of a power amplifier.

15. A method comprising:
converting a digital power level signal to generate a reference current signal and a bias signal in response to the power level signal;
adjusting a gain of the reference current signal by selecting one or more of a first plurality of current multipliers arranged in parallel branches and coupled to the reference current signal;
activating respective first plurality of switch or switches to switch in selected one or more of the first plurality of current multipliers;
de-activating a second plurality of switches coupled to respective second plurality of current multipliers, the second plurality of current multipliers arranged in parallel branches and coupled to the bias signal to adjust a DC level associated with a gain multiplied reference current signal, the second plurality of switches to switch out respective branches of the second plurality of current multipliers corresponding to activated branches of the first plurality of current multipliers to compensate for DC level changes when first plurality of current multipliers are switched in;
converting total switched in current from active branches to a voltage signal at a load to provide a gain adjusted and DC level compensated voltage signal; and
using the voltage signal to generate an analog power level signal to control a power level of a power amplifier.

16. The method of claim 15, further including oppositely tracking the second plurality of switches to switching operations of respective first plurality of switches, so that when a particular branch of the first plurality of current multipliers is activated, a corresponding branch of the second plurality of current multipliers is deactivated, and when a particular branch of the first plurality of current multipliers is de-activated, a corresponding branch of the second plurality of current multipliers is activated, to maintain a substantially constant DC level current to the load when adjusting the gain.

17. The method of claim 16, further including programming the first plurality of switches to select a gain for the reference current signal and the second plurality of switches respond correspondingly.

18. The method of claim 17, wherein the converting includes converting a GSM signal.

19. The method of claim 17, further including switching in and out a third plurality of current multipliers arranged in parallel branches and coupled to the bias signal to adjust the DC level associated with a gain multiplied reference current signal independently from the second plurality of current multipliers.

20. The method of claim 17, further including programmable control signals to switch in and out the third plurality of current multipliers.

* * * * *